(12) United States Patent
Ko

(10) Patent No.: US 11,961,642 B2
(45) Date of Patent: Apr. 16, 2024

(54) SHUNT RESISTOR MODULE

(71) Applicant: LG Energy Solution, Ltd., Seoul (KR)

(72) Inventor: Dong-Wan Ko, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 348 days.

(21) Appl. No.: 17/426,491

(22) PCT Filed: Aug. 10, 2020

(86) PCT No.: PCT/KR2020/010559
§ 371 (c)(1),
(2) Date: Jul. 28, 2021

(87) PCT Pub. No.: WO2021/029641
PCT Pub. Date: Feb. 18, 2021

(65) Prior Publication Data
US 2022/0102032 A1    Mar. 31, 2022

(30) Foreign Application Priority Data

Aug. 13, 2019 (KR) ........................ 10-2019-0098994

(51) Int. Cl.
*H01C 1/01* (2006.01)
*H01C 1/14* (2006.01)
*H05K 1/18* (2006.01)

(52) U.S. Cl.
CPC .................. *H01C 1/01* (2013.01); *H01C 1/14* (2013.01); *H05K 1/181* (2013.01);
(Continued)

(58) Field of Classification Search
CPC . H01C 1/01; H01C 1/14; H05K 1/181; H05K 2201/09063; H05K 2201/10022
See application file for complete search history.

(56) References Cited

U.S. PATENT DOCUMENTS 5,214,407 A * 5/1993 McKim, Jr. ............ H01C 17/24
338/195
6,163,461 A    12/2000 Watanabe
(Continued)

FOREIGN PATENT DOCUMENTS

CN       203013818 U     6/2013
DE       20318266 U1     2/2004
(Continued)

OTHER PUBLICATIONS

WO2019/097925 machine translation. (Year: 2019).*
(Continued)

*Primary Examiner* — Kyung S Lee
(74) *Attorney, Agent, or Firm* — Lerner David LLP

(57) ABSTRACT

A shunt resistor module, which includes a shunt resistor having a resistor unit having a predetermined resistance, plate-shaped terminal units respectively configured to extend at both sides of the resistor unit, and a voltage measurement lead pin configured to protrude perpendicular to the terminal unit and having an end portion bent to be parallel to the terminal unit, and a PCB substrate having an assembly guide portion formed to be cut inward by a predetermined depth from an outermost side thereof. The voltage measurement lead pin is fit into the assembly guide portion so that the resistor unit and the terminal unit are placed on a front surface of the PCB substrate and the end portion of the voltage measurement lead pin is caught at a rear surface of the PCB substrate.

19 Claims, 5 Drawing Sheets

(52) U.S. Cl.
CPC .............. *H05K 2201/09063* (2013.01); *H05K 2201/10022* (2013.01); *H05K 2201/10409* (2013.01); *H05K 2201/10446* (2013.01); *H05K 2201/10757* (2013.01)

(56) References Cited

U.S. PATENT DOCUMENTS

| | | | | |
|---|---|---|---|---|
| 8,598,976 | B2* | 12/2013 | Hetzler | .................. H01C 17/28 338/322 |
| 10,969,408 | B2* | 4/2021 | Miyajima | ............ G01R 15/207 |
| 2003/0146077 | A1* | 8/2003 | Enomoto | ................ G01R 1/203 200/61.53 |
| 2006/0226141 | A1 | 10/2006 | Suenaga et al. | |
| 2008/0238431 | A1 | 10/2008 | Schimmel | |
| 2009/0141210 | A1 | 6/2009 | Cho et al. | |
| 2018/0113153 | A1 | 4/2018 | Jang et al. | |
| 2018/0188295 | A1 | 7/2018 | Kameko et al. | |

FOREIGN PATENT DOCUMENTS

| | | |
|---|---|---|
| FR | 2903498 A1 | 1/2008 |
| JP | S62134224 U | 8/1987 |
| JP | 2546128 Y2 | 8/1997 |
| JP | H11288751 A | 10/1999 |
| JP | 200556731 A | 3/2005 |
| JP | 2009070988 A | 4/2009 |
| JP | 2012119507 A | 6/2012 |
| JP | 2017009419 A | 1/2017 |
| KR | 20090055684 A | 6/2009 |
| KR | 101407664 B1 | 6/2014 |
| KR | 101687384 B1 | 12/2016 |
| KR | 20170104828 A | 9/2017 |
| KR | 20180044725 A | 5/2018 |
| KR | 20190012872 A | 2/2019 |
| WO | 2007062943 A1 | 6/2007 |
| WO | WO-2019097925 A1 * | 5/2019 ........... F16D 43/284 |

OTHER PUBLICATIONS

International Search Report for Application No. PCT/KR2020/010559 dated Nov. 24, 2020, pp. 1-2.

Extended European Search Report for Application No. 20852846.3 dated May 13, 2022, pp. 1-5.

* cited by examiner

SHUNT RESISTOR MODULE

CROSS-REFERENCE TO RELATED APPLICATIONS

The present application is a national phase entry under 35 U.S.C. § 371 of International Application No. PCT/KR2020/010559 filed Aug. 10, 2020, published in Korean, which claims priority from KR Patent Application No. 10-2019-0098994 filed Aug. 13, 2019, all of which are incorporated herein by reference.

TECHNICAL FIELD

The present disclosure relates to a shunt resistor module, and more particularly, to a shunt resistor module including a shunt resistor and a printed circuit board (PCB) so that the shunt resistor may be directly inserted into and fixed to the PCB without using any structure for supporting the shunt resistor.

BACKGROUND ART

Secondary batteries currently commercialized include nickel cadmium batteries, nickel hydrogen batteries, nickel zinc batteries, lithium secondary batteries and so on. Among them, the lithium secondary batteries are more highlighted in comparison to nickel-based secondary batteries due to advantages such as free charging and discharging, caused by substantially no memory effect, very low self-discharge rate, and high energy density.

A power supply system for a battery pack using a secondary battery generally includes a current sensor for measuring a current. The current sensor monitors a state of the battery pack by measuring the current flowing through a charging and discharging path of the battery pack, and detects an overcurrent flowing through the battery pack. In addition, the current measured by the current sensor may be used as data for calculating a state of charge (SOC) or as a basis for determining whether a charging and discharging process is normally performed.

A battery pack using lithium secondary batteries, which has recently been in the spotlight as an energy storage device for electric vehicles, has a great charge and discharge current in the range of 100 A to 300 A. Thus, when measuring the current of the battery pack, a shunt resistor as shown in FIG. 1 is widely used as a current sensor. For reference, Patent Literature 1 discloses a device and method capable of diagnosing whether an abnormality occurs in a current sensor by providing the shunt resistor.

As shown in FIG. 1, in general, a shunt resistor 1 has a resistor unit 2 and terminal units 3 respectively connected to both ends of the resistor unit 2, and a lead pin 4 for voltage measurement is soldered on a planar portion of each terminal unit 3 to protrude in a direction perpendicular to the plane. An injection-molded structure is added to the shunt resistor and mounted on a PCB substrate to prevent the lead pin 4 of the shunt resistor from being damaged due to an external impact or the like.

However, the conventional shunt resistor module becomes a factor of increasing the unit price because an injection-molded product must be added when the shunt resistor is manufactured. In addition, if the lead pin 4 is welded onto the PCB in a state where the injection-molded structure is not properly coupled due to assembly tolerances or incorrect assembly of the shunt resistor and the injection-molded product, the lead pin 4 may be more easily broken even with a light impact, which may be a quality issue.

Therefore, there is a need for a way to stably mount the shunt resistor onto the PCB without the injection-molded structure.

SUMMARY

Technical Problem

The present disclosure is designed to solve the problems of the related art, and therefore the present disclosure is directed to providing a shunt resistor module in which a shunt resistor may be stably mounted onto a PCB without any injection-molded structure.

Other objects and advantages of the present disclosure will be described below, and will be appreciated by embodiments of the present disclosure. In addition, the objects and advantages of the present disclosure can be realized by components defined in the claims and a combination thereof.

Technical Solution

In one aspect of the present disclosure, there is provided a shunt resistor module, comprising: a shunt resistor; and a printed circuit board (PCB) substrate, wherein the shunt resistor is configured to be directly fixed to the PCB substrate,
wherein the shunt resistor includes a resistor unit having a predetermined resistance; first and second plate-shaped terminal units extending from respective sides of the resistor unit; and first and second voltage measurement lead pins including respective perpendicular portions protruding perpendicular to the first and second terminal units, respectively, and respective first bent portions parallel to the first and second terminal units, respectively, wherein the PCB substrate includes an assembly guide portion including first and second cuts cut into the PCB substrate from an outermost side of the PCB substrate by a predetermined depth, each cut having a cut width corresponding to a thickness of a corresponding voltage measurement lead pin, and wherein the first and second voltage measurement lead pins are adapted to fit into the first and second cuts of the assembly guide portion so that the resistor unit and the first and second terminal units are positioned on a front surface of the PCB substrate and the end portions of the voltage measurement lead pins are caught at a rear surface of the PCB substrate.

The voltage measurement lead pins may be plates, and the first bent portions may be spaced apart from a lower surface of the terminal unit.

Each voltage measurement lead pin may further include a respective second bent portion extending in parallel to an upper surface of the corresponding terminal unit, a lower end of the perpendicular portion may connected to the first bent portion, and an upper end of the perpendicular portion may be connected to the second bent portion.

The PCB substrate may further include a stopper member formed to protrude perpendicular to the front surface of the PCB substrate, wherein the stopper member is positioned to surround a corner region of the shunt resistor when the shunt resistor is directly fixed to the PCB substrate.

The PCB substrate may further include first and second voltage measurement terminals protruding on the rear surface of the PCB substrate and configured to contact the respective first bent portions of the voltage measurement lead pins.

Each voltage measurement terminal may be arched.

Each terminal unit may further include a first fastening hole perforated in a thickness direction of the terminal unit.

The PCB substrate may further include second fastening holes perforated in a thickness direction of the PCB substrate at locations corresponding to the first fastening holes of the shunt resistor, and the shunt resistor and the PCB substrate may be configured to be coupled to each other by fastening bolts through corresponding first and second fastening holes.

The front surface of the PCB substrate may have an insulation region, and the shunt resistor may be placed within the insulation region.

The shunt resistor may have a mirror symmetry across the resistor unit.

In another aspect of the present disclosure, there is also provided a battery module, comprising the shunt resistor module of any of the embodiments described herein. In another aspect of the present disclosure, there is also provided a shunt resistor configured to be directly fixed to a PCB substrate, the shunt resistor comprising: a resistor unit having a predetermined resistance; a first plate-shaped terminal unit extending from a first side of the resistor unit; and a first voltage measurement lead pin including a perpendicular portion protruding perpendicular to the first terminal unit, and a first bent portion parallel to the first terminal unit, wherein the first voltage measurement lead pin is adapted to fit into a first assembly guide portion cut into the PCB substrate from an outermost side of the PCB substrate at a predetermined depth so that the resistor unit and the first terminal unit are positioned at a front surface of the PCB substrate and the first bent portion of the first voltage measurement lead pin is caught at a rear surface of the PCB substrate, wherein a thickness of the first voltage measurement lead pin corresponds to a cut width of the first assembly guide portion.

The first voltage measurement lead pin may be a plate, the first bent portion may be spaced apart from a lower surface of the terminal unit, and the voltage measurement lead pin may further include a second bent portion extending in parallel to an upper surface of the terminal unit.

The first bent portion may be adapted to contact a voltage measurement terminal protruding on the rear surface of the PCB substrate.

The terminal unit may further include a first fastening hole perforated in a thickness direction of the terminal unit.

The first fastening hole may be configured to be coupled to a second fastening hole perforated in a thickness direction of the PCB substrate by a fastening bolt.

The shunt resistor may be configured to be placed within an insulation region on the front surface of the PCB substrate when the shunt resistor is directly fixed to the PCB substrate.

The shunt resistor may further include a second plate-shaped terminal unit extending from an opposite second side of the resistor unit and a second voltage measurement lead pin including a perpendicular portion protruding perpendicular to the second terminal unit, and a first bent portion parallel to the second terminal unit, wherein the second voltage measurement lead pin is adapted to fit into a second assembly guide portion cut into the PCB substrate from an outermost side of the PCB substrate at a predetermined depth so that the resistor unit and the second terminal unit are positioned at a front surface of the PCB substrate and the first bent portion of the second voltage measurement lead pin is caught at a rear surface of the PCB substrate, wherein a thickness of the second voltage measurement lead pin corresponds to a cut width of the second assembly guide portion.

The shunt resistor may have a mirror symmetry across the resistor unit.

Advantageous Effects

According to an embodiment of the present disclosure, the shunt resistor may be stably mounted onto the PCB without any injection-molded structure.

More specifically, the shape and structure of the voltage measurement lead pin of the shunt resistor according to the present disclosure is designed to have sufficient durability, and the PCB substrate is designed to include an assembly guide portion corresponding to the voltage measurement lead pin.

Therefore, according to the present disclosure, the mechanical assembly and circuit connection between the shunt resistor and the PCB substrate may be stably made integrally without the existing injection-molded structure.

The effects of the present disclosure are not limited to the above, and effects not mentioned herein may be clearly understood from the present specification and the accompanying drawings by those skilled in the art.

DETAILED DESCRIPTION

Figure 1:
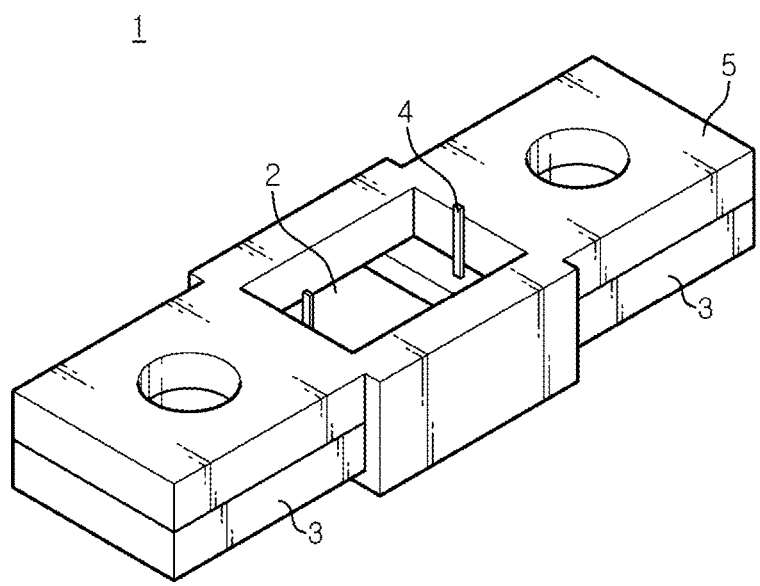
FIG. 1 is a perspective view showing a conventional shunt resistor.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

A shunt resistor module according to the present disclosure is provided so that a shunt resistor 100 may be directly fixed to a PCB substrate 200 without using an injection-molded structure, which is fixedly mounted to the shunt resistor 1 in the prior art. Hereinafter, main components of the shunt resistor module will be described in detail.

Figure 2:
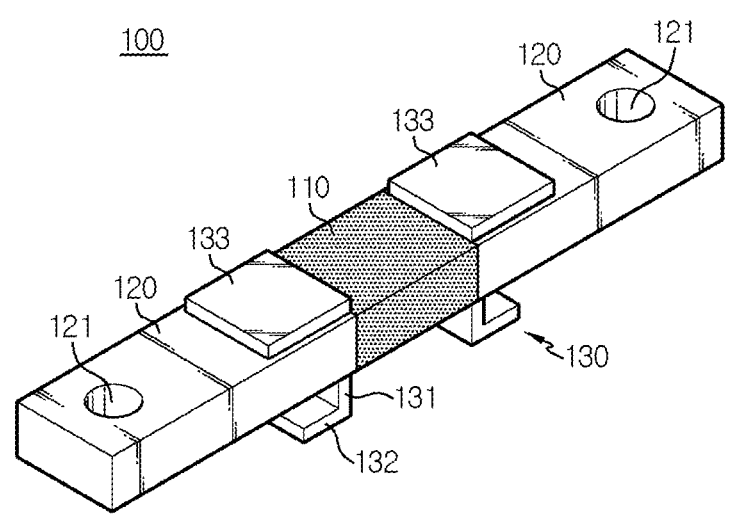
FIG. 2 is a perspective view showing a shunt resistor according to an embodiment of the present disclosure.
Figure 3:
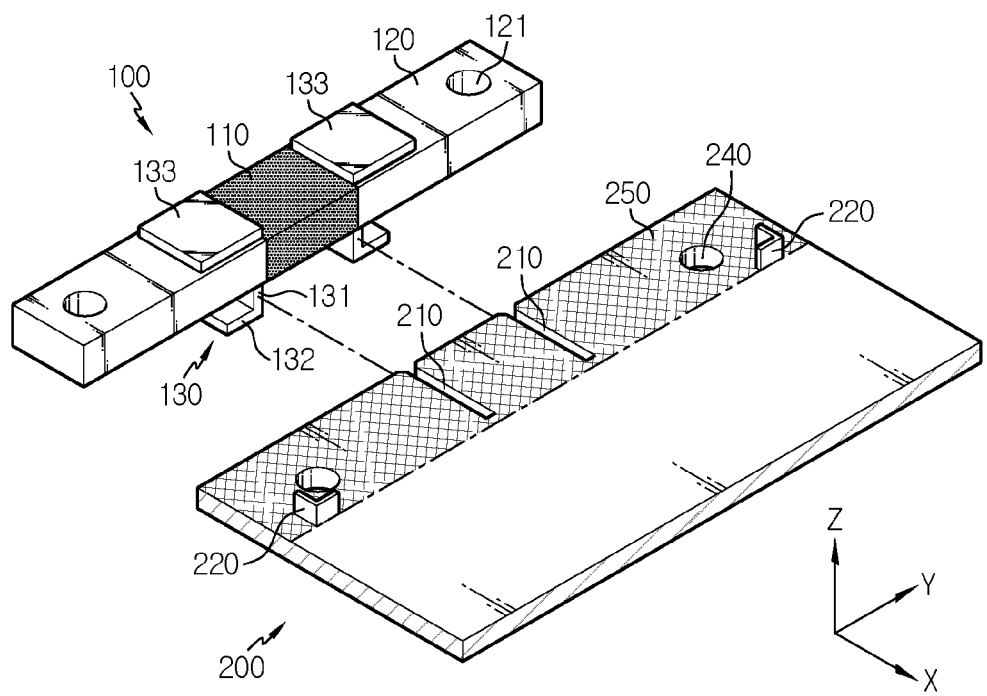
FIG. 3 is a perspective view showing a PCB substrate that may be mounted to the shunt resistor of FIG. 2.

FIG. 2 is a perspective view showing a shunt resistor 100 according to an embodiment of the present disclosure, and FIG. 3 is a perspective view showing a PCB substrate 200 that may be mounted to the shunt resistor 100 of FIG. 2.

Referring to these drawings, the shunt resistor module according to an embodiment of the present disclosure includes a shunt resistor 100 and a PCB substrate 200 that is provided to be coupled to the shunt resistor 100 in a slide manner.

The shunt resistor 100 is for measuring a voltage of a known resistor and converting the voltage into a current value by applying Ohm's Law, when it is difficult to directly measure a large current.

Specifically, as shown in FIG. 2, the shunt resistor 100 includes a resistor unit 110 having a predetermined resistance at center thereof, plate-shaped terminal units 120 configured to extend at both sides of the resistor unit 110 and made of a conductive metal, and a voltage measurement lead pin 130 respectively connected to the terminal unit 120. That is, the shunt resistor 100 may be configured such that both sides thereof have a symmetrical shape based on the resistor unit 110.

The resistor unit 110 is made of a material having a higher resistivity than the terminal units 120 at both sides. As the resistor unit 110, for example, an alloy containing manganese (Mn), nickel (Ni) or manganese (Mn) and copper (Cu) may be employed.

A measured voltage is applied to the resistor unit 110, and the voltage measurement lead pin 130 is connected to a voltage measurement terminal 230 of the PCB substrate 200 to measure a voltage so that the magnitude of the measured current may be detected.

The terminal unit 120 is a plate-shaped conductor plate connected to each of both sides of the resistor unit 110 and made of a conductive metal such as copper. Each terminal unit 120 has a first fastening hole 121 perforated in a thickness direction thereof so that a fastening member such as a bolt is inserted therein.

In particular, the voltage measurement lead pin 130 according to the present disclosure may be provided as a metal plate with rigidity. The metal plate may have a width corresponding to the width of the terminal unit 120 and a thickness corresponding to the width of an assembly guide portion 210 of the PCB substrate 200, explained later.

Figure 8:
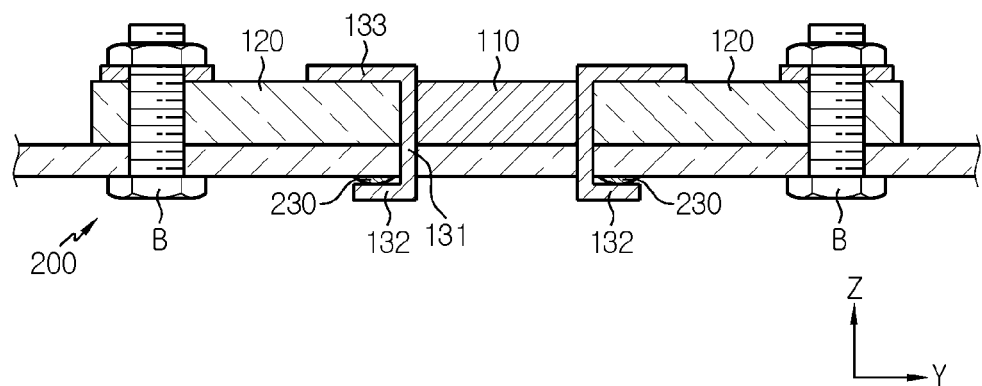
FIG. 8 is a sectional view, taken along the line I-I' of 6.

The voltage measurement lead pin 130 includes a perpendicular portion 131, a first bent portion 132 and a second bent portion 133, which may be integrally formed to have an approximately '⊂'-shaped structure (see FIG. 8).

The perpendicular portion 131 is a portion that extends perpendicular to the terminal unit 120, and the first bent portion 132 is bent at a right angle from a lower end of the perpendicular portion 131 and extending to be spaced apart from a lower surface of the terminal unit 120. Here, a gap between the terminal unit 120 and the first bent portion 132 may be equal to or slightly larger than the thickness of the PCB substrate 200. The second bent portion 133 is a part extending parallel to an upper surface of the terminal unit 120.

The first bent portion 132 may be connected to a lower end of the perpendicular portion 131, the second bent portion 133 may be connected to an upper end of the perpendicular portion 131, and the first bent portion 132 and the second bent portion 133 may extend side by side in the same direction. In other words, they may be referred to as an approximately '⊂'-shaped structure.

The voltage measurement lead pin 130 may be attached between the terminal unit 120 and the resistor unit 110. For example, two voltage measurement lead pins 130 may be attached between the terminal unit 120 and the resistor unit 110, respectively, by fitting the perpendicular portion 131 of the voltage measurement lead pin 130 into a coupling groove (not shown) formed in advance at a vertical surface of the terminal unit 120 at the left, temporarily fixing the terminal unit 120 at the left and one voltage measurement lead pin 130, then welding one side of the resistor unit 110, then, in the same way, temporarily fixing the terminal unit 120 at the right and one voltage measurement lead pin 130, and then welding the other side of the resistor unit 110.

In this way, since the voltage measurement lead pin 130 is provided as a rigid plate with a predetermined width and thickness and is firmly coupled between the terminal unit 120 and the resistor unit 110, the voltage measurement lead pin 130 of the present disclosure has very strong durability, compared to a simple conventional lead pin (see FIG. 1). Therefore, as will be described later, the voltage measurement lead pin 130 may be used as a simple circuit connection means and a mechanical assembly means simultaneously.

Figure 4:
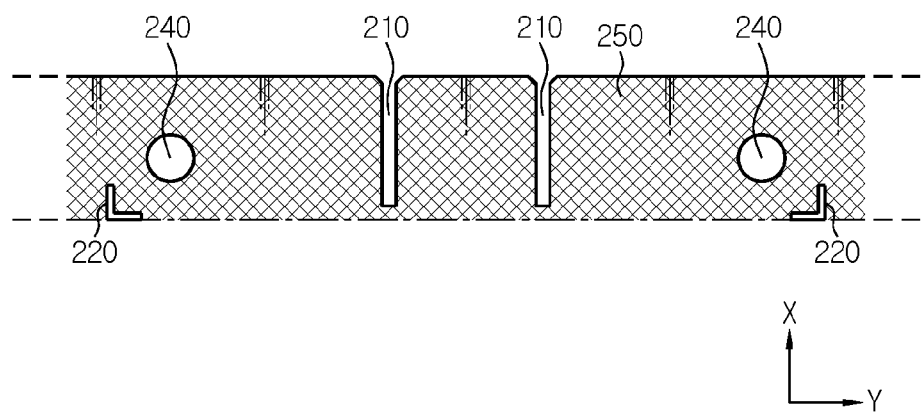
FIG. 4 is a plan view showing a main part of the PCB substrate of FIG. 3.
Figure 5:
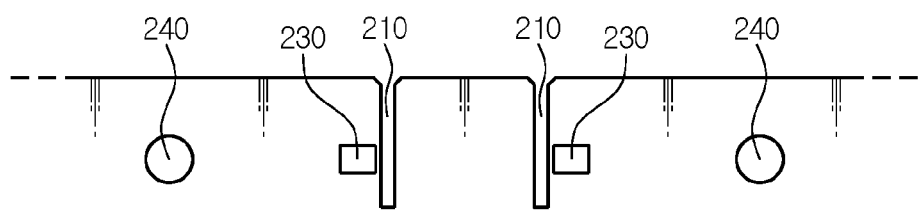
FIG. 5 is a rear view showing a main part of the PCB substrate of FIG. 3.

Meanwhile, referring to FIGS. 3 to 5, the PCB substrate 200 includes an assembly guide portion 210, a stopper member 220, a voltage measurement terminal 230, a second fastening hole 240, and an insulation region 250.

The assembly guide portion 210 may be formed to be cut inward by a predetermined depth from an outermost side thereof to have a cut width corresponding to a thickness of the voltage measurement lead pin 130. The assembly guide portion 210 is provided to correspond to two voltage measurement lead pins 130.

The shunt resistor 100 may be placed on the PCB substrate 200 as the voltage measurement lead pin 130 is fit into the assembly guide portion 210 (in the X-axis direction). More specifically, the part fitted into and guided by the assembly guide portion 210 is the perpendicular portion 131 of the voltage measurement lead pin 130. At this time, the resistor unit 110 and the terminal unit 120 of the shunt resistor 100 may be disposed on a front surface of the PCB substrate 200, and the first bent portion 132 of the voltage measurement lead pin 130 may be disposed on a rear surface of the PCB substrate 200.

Two voltage measurement lead pins 130 are fitted along two assembly guide portions 210 at the same time. In this case, the shunt resistor 100 may be placed correctly with respect to the PCB substrate 200 without being twisted left or right. Therefore, there is no need for a separate alignment operation to place the shunt resistor 100 at a proper position on the PCB substrate 200.

In addition, after the shunt resistor 100 is fit into the PCB substrate 200, the first bent portion 132 of the voltage measurement lead pin 130 is caught in a vertical direction with respect to the PCB substrate 200 since it is bent from the perpendicular portion 131. Therefore, the shunt resistor 100 may be temporarily fixed in upper and lower directions (±Z-axis direction) and left and right directions (±Y-axis direction) with respect to the PCB substrate 200. Additionally, the shunt resistor 100 may be safely fixed by integrally fastening a bolt with other bus bars 300a, 300b and the PCB substrate 200.

The stopper member 220 may be provided at a position deeper than the assembly guide portion 210.

The stopper member 220 may be provided in a shape protruding perpendicular to the front surface of the PCB substrate 200 to surround a corner region of the shunt resistor 100. That is, the stopper member 220 may have a pillar form with an 'L'-shaped cross section.

Figure 6:
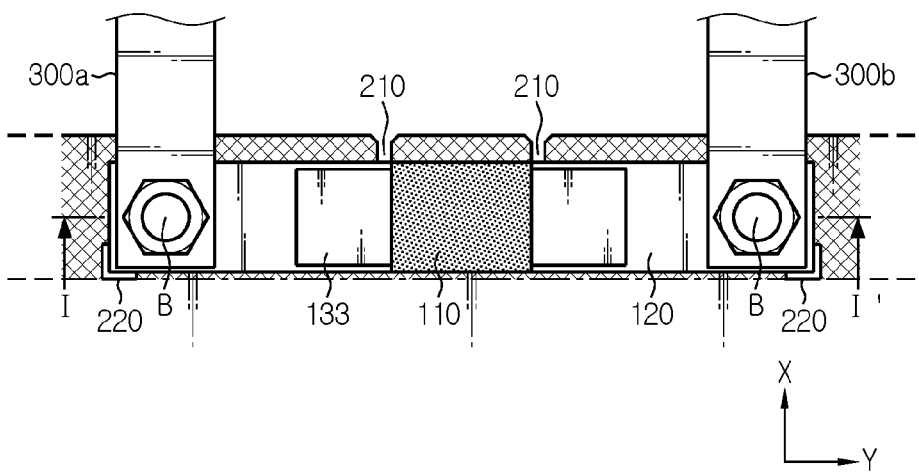
FIG. 6 is a plan view showing a main part of the PCB substrate to which the shunt resistor is coupled.

As shown in FIG. 6, the stopper member 220 supports the corner region of the shunt resistor 100 so that the shunt resistor 100 cannot be pushed into the PCB substrate 200 any more when the voltage measurement lead pin 130 is fully fit into the assembly guide portion 210.

By providing the stopper member 220, it is possible to mitigate the impact that the voltage measurement lead pin 130 or assembly guide portion 210 will receive when the shunt resistor 100 is pushed into the PCB with an excessive force. In addition, by means of the stopper member 220, it is also possible to solve even a slight distortion of the shunt resistor 100.

Figure 7:
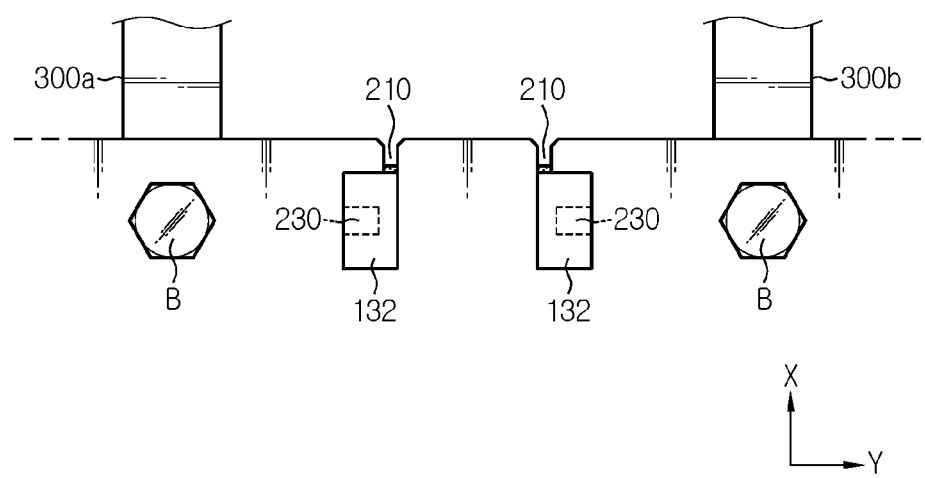
FIG. 7 is a rear view showing a main part of the PCB substrate to which the shunt resistor is coupled.

Meanwhile, as shown in FIGS. 5, 7 to 8, in the PCB substrate 200 according to the present disclosure, the voltage measurement terminal 230 is located on the rear surface of the PCB substrate 200. As described above, since the first bent portion 132 of the voltage measurement lead pin 130 is disposed on the rear surface of the PCB substrate 200, the voltage measurement terminal 230 of the PCB substrate 200 is also provided on the rear surface correspondingly.

The voltage measurement terminal 230 may have an arch structure that is provided to protrude downward from the rear surface of the PCB substrate 200. By providing the voltage measurement terminal 230 in a semicircular or semi-elliptical shape, the first bent portion 132 of the voltage measurement lead pin 130 may move along the curved surface of the voltage measurement terminal 230 when sliding (in the ±X-axis direction).

In addition, the voltage measurement terminal 230 and the first bent portion 132 of the voltage measurement lead pin 130 may contact each other in a state of being compressed in the upper and lower directions, so there is no need to weld them to make contact.

That is, the voltage measurement terminal 230 and the first bent portion 132 of the voltage measurement lead pin 130 may be mechanically kept in contact by fitting, so welding is not necessary. In this case, since soldering is omitted, the working time for mounting the shunt resistor 100 may be greatly shortened. Of course, it is also possible to reinforce the contact by additionally soldering the voltage measurement lead pin 130 and the voltage measurement terminal 230.

The PCB substrate 200 further has a second fastening hole 240 perforated in a thickness direction thereof at a position corresponding to the first fastening hole 121 of the shunt resistor 100. When the shunt resistor 100 is pushed to a specified position on the PCB substrate 200, the first fastening hole 121 of the shunt resistor 100 and the second fastening hole 240 of the PCB substrate 200 may be matched up and down.

Both ends of the shunt resistor 100 may be firmly coupled to the PCB substrate 200 by inserting a bolt into the first fastening hole 121 and the second fastening hole 240. Of course, it is also possible to couple one end of other bus bars 300a, 300b to the upper surface of the terminal unit 120 with a bolt so that, for example, a current of the battery module may flow through the resistor unit 110.

The PCB substrate 200 may further include an insulation region 250 on the front surface thereof.

The insulation region 250 may be a region of the front surface of the PCB on which the shunt resistor 100 is placed, which is coated with an insulating sheet or material made of silicon. By securing the insulation region 250 in this way, even if the shunt resistor 100 is directly fixed to the upper surface of the PCB substrate 200, it does not give any electric influence on elements located in other regions of the PCB substrate 200.

Subsequently, (see FIGS. 3, 6 to 8) a method of assembling the shunt resistor module according to an embodiment of the present disclosure will be described briefly.

First, the perpendicular portion 131 of the voltage measurement lead pin 130 is aligned with the assembly guide portion 210, and the shunt resistor 100 is fit into the outermost side of the PCB substrate 200 in a slide manner. At this time, in order to ensure that the shunt resistor 100 is assembled at a correct position with respect to the PCB substrate 200, it is sufficient to just check whether both corner regions of the terminal units 120 of the shunt resistor 100 are in contact with the stopper members 220 of the PCB substrate 200.

Next, a bolt is inserted into the first fastening hole 121 of the shunt resistor 100 and the second fastening hole 240 of the PCB substrate 200, and a screw is fastened to an end portion of the bolt to completely fix the shunt resistor 100 to the PCB substrate 200.

As described above, the first bent portion 132 of the voltage measurement lead pin 130 and the voltage measurement terminal 230 of the PCB substrate 200 are mechanically in contact with each other in a compressed state, so there is no need to weld the corresponding parts, but welding may also be formed to further enhance the electrical reliability Later, if it is needed to measure a current of a battery module by using the resistor unit 110 of the shunt resistor 100, bus bars connected to terminals of the battery module are connected to the terminal units 120 of the shunt resistor 100. At this time, the screw is loosened, a bolt is inserted into a hole of the bus bar, and then the screw is fastened again to the end portion of the bolt to fix the bus bar to the terminal unit 120 of the shunt resistor 100.

As described above, if the shunt resistor module according to the present disclosure is used, it is possible to stably mount the shunt resistor 100 on the PCB without any injection-molded structure according to the prior art. In addition, the shunt resistor module of the present disclosure may be regarded as being more improved in terms of assembly, durability, fixability and economy based on the above-described components as compared to the conventional shunt resistor module.

Meanwhile, a battery module according to the present disclosure may include the shunt resistor module described above. In addition to the shunt resistor module, the battery module may further include battery cells, a module case, and various devices for controlling charging and discharging of the battery cells, such as a battery management system (BMS), a current sensor and a fuse.

A plurality of battery modules may be connected in series and/or in parallel to configure a battery pack or an energy storage system.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, even though the terms expressing directions such as "upper", "lower", "left" and "right" are used in the specification, they are just for convenience of description and can be expressed differently depending on the location of a viewer or a subject, as apparent to those skilled in the art.

What is claimed is:

1. A shunt resistor module, comprising:
a shunt resistor; and
a printed circuit board (PCB) substrate, wherein the shunt resistor is configured to be directly fixed to the PCB substrate,
wherein the shunt resistor includes:
a resistor unit having a predetermined resistance;
first and second plate-shaped terminal units extending from respective sides of the resistor unit; and
first and second voltage measurement lead pins including respective perpendicular portions protruding perpendicular to the first and second terminal units, respectively, and respective first bent portions parallel to the first and second terminal units, respectively,
wherein the PCB substrate includes an assembly guide portion including first and second cuts cut into the PCB substrate from an outermost side of the PCB substrate by a predetermined depth, each cut having a cut width corresponding to a thickness of a corresponding voltage measurement lead pin, and
wherein the first and second voltage measurement lead pins are shaped to fit through the first and second cuts of the assembly guide portion so that the resistor unit and the first and second terminal units are positioned on a front surface of the PCB substrate and the first bent portions of the voltage measurement lead pins are caught at a rear surface of the PCB substrate.

2. The shunt resistor module according to claim 1, wherein the voltage measurement lead pins are plates, and wherein the first bent portions are spaced apart from a lower surface of the terminal unit.

3. The shunt resistor module according to claim 2, wherein each voltage measurement lead pin further includes a respective second bent portion extending in parallel to an upper surface of the corresponding terminal unit,
a lower end of the perpendicular portion is connected to the first bent portion, and
an upper end of the perpendicular portion is connected to the second bent portion.

4. The shunt resistor module according to claim 1, wherein the PCB substrate further includes a stopper member formed to protrude perpendicular to the front surface of the PCB substrate, wherein the stopper member is positioned to surround a corner region of the shunt resistor when the shunt resistor is directly fixed to the PCB substrate.

5. The shunt resistor module according to claim 1, wherein the PCB substrate further includes first and second voltage measurement terminals protruding on the rear surface of the PCB substrate and configured to contact the respective first bent portions of the voltage measurement lead pins.

6. The shunt resistor module according to claim 5, wherein each voltage measurement terminal is arched.

7. The shunt resistor module according to claim 1, wherein each terminal unit further includes a first fastening hole perforated in a thickness direction of the terminal unit.

8. The shunt resistor module according to claim 7, wherein the PCB substrate further includes second fastening holes perforated in a thickness direction of the PCB substrate at locations corresponding to the first fastening holes of the shunt resistor, and
the shunt resistor and the PCB substrate are configured to be coupled to each other by fastening bolts through corresponding first and second fastening holes.

9. The shunt resistor module according to claim 1, wherein the front surface of the PCB substrate has an insulation region, and the shunt resistor is placed within the insulation region.

10. The shunt resistor module according to claim 1, wherein the shunt resistor has a mirror symmetry across the resistor unit.

11. A battery module, comprising the shunt resistor module according to claim 1.

12. A shunt resistor configured to be directly fixed to a PCB substrate, the shunt resistor comprising:
a resistor unit having a predetermined resistance;
a first plate-shaped terminal unit extending from a first side of the resistor unit; and
a first voltage measurement lead pin including a perpendicular portion protruding perpendicular to the first terminal unit, and a first bent portion parallel to the first terminal unit,
wherein the first voltage measurement lead pin is shaped to fit through a first assembly guide portion cut into the PCB substrate from an outermost side of the PCB substrate at a predetermined depth so that the resistor unit and the first terminal unit are positioned at a front surface of the PCB substrate and the first bent portion of the first voltage measurement lead pin is caught at a rear surface of the PCB substrate, wherein a thickness of the first voltage measurement lead pin corresponds to a cut width of the first assembly guide portion.

13. The shunt resistor according to claim 12, wherein the first voltage measurement lead pin is a plate, the first bent portion is spaced apart from a lower surface of the terminal unit, and the voltage measurement lead pin further includes a second bent portion extending in parallel to an upper surface of the terminal unit.

14. The shunt resistor according to claim 12, wherein the first bent portion is shaped to contact a voltage measurement terminal protruding on the rear surface of the PCB substrate.

15. The shunt resistor according to claim 12, wherein the terminal unit further includes a first fastening hole perforated in a thickness direction of the terminal unit.

16. The shunt resistor according to claim 15, wherein the first fastening hole is configured to be coupled to a second fastening hole perforated in a thickness direction of the PCB substrate by a fastening bolt.

17. The shunt resistor module according to claim 12, wherein the shunt resistor is configured to be placed within an insulation region on the front surface of the PCB substrate when the shunt resistor is directly fixed to the PCB substrate.

18. The shunt resistor of claim 12, further comprising:

a second plate-shaped terminal unit extending from an opposite second side of the resistor unit; and a second voltage measurement lead pin including a perpendicular portion protruding perpendicular to the second terminal unit, and a first bent portion parallel to the second terminal unit, wherein the second voltage measurement lead pin is shaped to fit through a second assembly guide portion cut into the PCB substrate from an outermost side of the PCB substrate at a predetermined depth so that the resistor unit and the second terminal unit are positioned at a front surface of the PCB substrate and the first bent portion of the second voltage measurement lead pin is caught at a rear surface of the PCB substrate, wherein a thickness of the second voltage measurement lead pin corresponds to a cut width of the second assembly guide portion.

19. The shunt resistor according to claim 18, wherein the shunt resistor has a mirror symmetry across the resistor unit.

\* \* \* \* \*